(12) United States Patent
Li

(10) Patent No.: US 10,199,510 B2
(45) Date of Patent: Feb. 5, 2019

(54) THIN FILM TRANSISTOR, THIN FILM TRANSISTOR MANUFACTURING METHOD AND ARRAY SUBSTRATE

(71) Applicant: Boe Technology Group Co., Ltd., Beijing (CN)

(72) Inventor: Xuyuan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 14/906,490

(22) PCT Filed: Aug. 12, 2015

(86) PCT No.: PCT/CN2015/086756
§ 371 (c)(1),
(2) Date: Jan. 20, 2016

(87) PCT Pub. No.: WO2016/150075
PCT Pub. Date: Sep. 29, 2016

(65) Prior Publication Data
US 2017/0110594 A1    Apr. 20, 2017

(30) Foreign Application Priority Data

Mar. 24, 2015  (CN) .......................... 2015 1 0130433

(51) Int. Cl.
| H01L 29/786 | (2006.01) |
| H01L 21/02 | (2006.01) |
| H01L 21/44 | (2006.01) |
| H01L 29/45 | (2006.01) |
| H01L 29/66 | (2006.01) |
| H01L 27/12 | (2006.01) |

(52) U.S. Cl.
CPC .. *H01L 29/78696* (2013.01); *H01L 21/02244* (2013.01); *H01L 21/44* (2013.01);
(Continued)

(58) Field of Classification Search
None
See application file for complete search history.

(56) References Cited

U.S. PATENT DOCUMENTS 8,049,225 B2 * 11/2011 Yamazaki ......... H01L 29/78618
257/43
2006/0043377 A1 * 3/2006 Hoffman ............ H01L 29/7869
257/72
(Continued)

FOREIGN PATENT DOCUMENTS

| CN | 101645462 | 2/2010 |
| CN | 101728433 A | 6/2010 |
(Continued)

OTHER PUBLICATIONS

International Search Report and Written Opinion from PCT/CN2015/086756 dated Nov. 10, 2015.
(Continued)

*Primary Examiner* — Michelle Mandala
(74) *Attorney, Agent, or Firm* — Calfee, Halter & Griswold LLP

(57) ABSTRACT

The present disclosure relates to a thin film transistor, a method for manufacturing a thin film transistor and an array substrate. The thin film transistor comprises an active layer, a source and a drain, the source comprising a source first conductive layer and a source first buffer layer, the drain comprising a drain first conductive layer and a drain first buffer layer; at least a part of an upper surface of the source first buffer layer and at least a part of an upper surface of the drain first buffer layer being in contact with a lower surface of the active layer, at least a part of a side wall of the source first conductive layer and at least a part of a side wall of the drain first conductive layer being in contact with the active layer, the side wall of the source first conductive layer and the side wall of the drain first conductive layer in contact
(Continued)

with the active layer being formed with an oxide layer. The composition of the active layer of the above thin film transistor would not be damaged by the source first conductive layer and the drain first conductive layer, in which way higher electron mobility can be guaranteed for the thin film transistor, and the thin film transistor is maintained in a good electric property and stability.

17 Claims, 5 Drawing Sheets

(52) U.S. Cl.
CPC ........ *H01L 29/45* (2013.01); *H01L 29/66969* (2013.01); *H01L 29/7869* (2013.01); *H01L 27/1225* (2013.01)

(56) References Cited

U.S. PATENT DOCUMENTS

| | | | |
|---|---|---|---|
| 2008/0038882 A1* | 2/2008 | Takechi | H01L 29/4908 438/151 |
| 2010/0090217 A1 | 4/2010 | Akimoto | |
| 2011/0133177 A1* | 6/2011 | Suzawa | H01L 27/1225 257/43 |
| 2013/0299817 A1 | 11/2013 | Park et al. | |

FOREIGN PATENT DOCUMENTS

| | | |
|---|---|---|
| CN | 101740630 | 6/2010 |
| CN | 101752425 | 6/2010 |
| CN | 101771072 | 7/2010 |
| CN | 104733542 | 6/2015 |
| JP | 2004273614 | 9/2004 |

OTHER PUBLICATIONS

Second Office Action for Chinese Application No. 201510130433.3 dated Jun. 22, 2017.
Third Office Action for Chinese Patent Application No. 201510130433.3 dated Sep. 19, 2017.
Decision on Rejection for Chinese Patent Application No. 201510130433.3 dated Apr. 23, 2018.
Fourth Office Action for Chinese Patent Application No. 201510130433.3 dated Jan. 12, 2018.
Office action from Chinese Application No. 201510130433.3 dated Mar. 21, 2017.

* cited by examiner

THIN FILM TRANSISTOR, THIN FILM TRANSISTOR MANUFACTURING METHOD AND ARRAY SUBSTRATE

RELATED APPLICATIONS

This application is the U.S. national stage entry of PCT/CN2015/086756, with an international filing date of Aug. 12, 2015, which claims priority to Chinese Patent Application Serial No. 201510130433.3, filed on Mar. 24, 2015, the entire disclosures of which are incorporated by reference herein.

FIELD

The present disclosure relates to the display technology field and, in particular, to a thin film transistor, a method for manufacturing a thin film transistor and an array substrate.

BACKGROUND

A thin film transistor using an oxide semiconductor, such as indium gallium zinc oxide (IGZO) and indium tin zinc oxide (ITZO), as active layer, has a higher electron mobility; whereas a thin film transistor using low-resistivity metal materials such as copper (Cu) and silver (Ag) as gate, source and drain may have an substantially lower resistance; therefore, a thin film transistor in a large-size display device generally uses an oxide semiconductor as an active layer, and uses copper (Cu), silver (Ag) or other low-resistivity metal materials as gate, source and drain. Based on the above two advantages, the thin film transistor as manufactured can achieve a higher resolution, and a higher refresh rate, thus obtaining a better displaying effect.

FIG. 1 is a schematic diagram of a thin film transistor in a prior art large-size display device. As shown in FIG. 1, a thin film transistor 1 is manufactured on a substrate 2, and comprises a gate 10, an active layer 11, a source 12 and a drain 13. Therein, the active layer 11 uses an oxide semiconductor material such as IGZO, ITZO, etc. so as to make the thin film transistor 1 have a higher electron mobility; and the active layer 11 is located above the source 12 and the drain 13 (i.e. the source 12 and the drain 13 are manufactured prior to the active layer 11). The source 12 comprises a source first conductive layer 120 and a source second buffer layer 121 arranged below the source first conductive layer 120, and a source first buffer layer 122 arranged above the source first conductive layer 120. The drain 13 comprises a drain first conductive layer 130 and a drain second buffer layer 131 arranged below the drain first conductive layer 130, and a drain first buffer layer 132 arranged above the drain first conductive layer 130.

Specifically, the source first conductive layer 120 can be specifically made of Cu, to lower the resistance of the source. However, since Cu has a poor adhesion to the base layer where the source 12 resides (located below the source 12; when the thin film transistor 1 is a bottom gate structure, the base layer is generally a gate insulating layer, and when the thin film transistor 1 is a top gate structure, the base layer is generally the substrate 2), the source second buffer layer 121 is arranged below the source first conductive layer 120. The source second buffer layer 121 can be specifically made of molybdenum (Mo), titanium (Ti), chromium (Cr), molybdenum niobium alloy (MoNb), etc., in order to enable a greater adhesion between the source 12 and the base layer (the metal or alloy of Mo, Ti, Cr and MoNb have a greater adhesion to the base layer, while Cu has also a greater adhesion to these metals or alloy). The source first buffer layer 122 can also be made of Mo, Ti, Cr, MoNb, etc., for avoiding contact between an upper surface of the source first conductive layer 120 and the active layer 11, and thus preventing the Cu atoms from diffusing into the active layer 11 and preventing the oxygen in the active layer 11 from being absorbed by the source first conductive layer 120. Meanwhile, the source first buffer layer 122 can further form a fine ohmic contact with the active layer 11.

The drain first conductive layer 130, the drain second buffer layer 131, and the drain first buffer layer 132 in the drain 13 are similar to those in the source 12, which will not be repeated here.

In the above thin film transistor 1, a side wall of the source first conductive layer 120 and the drain first conductive layer 130 is in contact with the active layer 11, such that the easily diffusing Cu atoms in the source first conductive layer 120 and the drain first conductive layer 130 will diffuse into the active layer 11. Meanwhile, the source first conductive layer 120 and the drain first conductive layer 130 will also absorb the oxygen in the active layer 11, making the composition of the active layer 11 change, affecting the electron mobility of the thin film transistor 1, and causing the electric property and stability of the thin film transistor 1 to reduce.

SUMMARY

In order to at least solve one of the technical problems existing in the prior art, the present disclosure proposes a thin film transistor, a method for manufacturing a thin film transistor and an array substrate, which can avoid damaging the composition of the active layer, which in turn affecting the electron mobility of the thin film transistor, and thus can make the thin film transistor have a good electric property and stability.

According to a first aspect of the present disclosure, in order to achieve the object of the present disclosure, a thin film transistor is provided, which may comprise an active layer, a source and a drain, said source comprising a source first conductive layer and a source first buffer layer, said source first buffer layer being arranged on said source first conductive layer, said drain comprising a drain first conductive layer and a drain first buffer layer, said drain first buffer layer being arranged on said drain first conductive layer; at least a part of an upper surface of said source first buffer layer and at least a part of an upper surface of said drain first buffer layer being in contact with a lower surface of said active layer, at least a part of a side wall of said source first conductive layer and at least a part of a side wall of said drain first conductive layer being in contact with said active layer, the side wall of said source first conductive layer in contact with said active layer being formed with an oxide layer, the side wall of said drain first conductive layer in contact with said active layer being formed with an oxide layer.

According to one embodiment, said active layer may be manufactured with an oxide semiconductor.

According to another embodiment, said source first conductive layer and drain first conductive layer may have a resistivity lower than $2.83 \times 10^{-8}$ $\Omega \cdot m$.

According to yet another embodiment, said source first conductive layer may be made of at least one of copper, silver and gold; said drain first conductive layer may be made of at least one of copper, silver and gold.

According to yet another embodiment, said source may also comprise a source second buffer layer arranged below said source first conductive layer; said drain may also comprise a drain second buffer layer arranged below said drain first conductive layer.

According to one embodiment, the oxide layer of said source is obtained by oxidizing said source first conductive layer, and the oxide layer of said drain is obtained by oxidizing said drain first conductive layer.

According to another embodiment, the oxide layer of said source and the oxide layer of said drain both have a thickness no less than 5 nm.

According to a second aspect of the present disclosure, a method for manufacturing a thin film transistor is provided, which comprises:

S10, forming a pattern of a source comprising a source first conductive layer and a source first buffer layer, and forming a pattern of a drain comprising a drain first conductive layer and a drain first buffer layer;

S20, forming an oxide layer on a side wall of the source first conductive layer opposing the drain, and forming an oxide layer on a side wall of the drain first conductive layer opposing the source;

S30, forming a pattern of an active layer.

According to one embodiment, said method for manufacturing a thin film transistor may further comprise, prior to step S10:

S1, forming a pattern of a gate.

Alternatively, said method for manufacturing a thin film transistor may further comprise, after step S30:

S40, forming a pattern of a gate.

According to another embodiment, in step S20, a plasma of at least one of $N_2O$ and $O_2$ may be used to perform a plasma treatment of the side wall of the source first conductive layer and the side wall of the drain first conductive layer, such that an oxide layer is obtained on the side wall of the source first conductive layer opposing the drain and on the side wall of the drain first conductive layer opposing the source.

According to a third aspect of the present disclosure, an array substrate is also provided, which comprises the above thin film transistor provided by the present disclosure.

The present disclosure has the following advantageous effects:

In the thin film transistor provided by the present disclosure, the side wall of the source first conductive layer in contact with the active layer is formed with an oxide layer, and the side wall of the drain first conductive layer in contact with the active layer is formed with an oxide layer, which accordingly can avoid diffusion of the atoms/molecules of the source first conductive layer and the drain first conductive layer into the active layer, and avoid absorption of the oxygen or other elements in the active layer by the source first conductive layer and the drain first conductive layer. As a result, the thin film transistor provided by the present disclosure can keep the composition of the active layer from being damaged by the source first conductive layer and the drain first conductive layer, which accordingly can guarantee electron mobility of the thin film transistor and maintain the thin film transistor in a good electric property and stability.

In the thin film transistor manufacturing method provided by the present disclosure, an oxide layer is formed on a side wall of the source first conductive layer opposing the drain, and an oxide layer is formed on a side wall of the drain first conductive layer opposing the source. The oxide layer can avoid diffusion of the atoms/molecules of the source first conductive layer and the drain first conductive layer into the active layer, and avoid absorption of the oxygen or other elements in the active layer by the source first conductive layer and the drain first conductive layer. As a result, the thin film transistor manufacturing method provided by the present disclosure can keep the molecular structure of the active layer from being damaged by the source first conductive layer and the drain first conductive layer, which accordingly can guarantee electron mobility of the thin film transistor and maintain the thin film transistor in a good electric property and stability.

The array substrate provided by the present disclosure uses the above thin film transistor provided by the present disclosure, which accordingly can maintain the thin film transistor in a good electric property and stability, and thereby enable the display device using said array substrate to have a good displaying effect.

BRIEF DESCRIPTION OF DRAWINGS

The accompanying drawings are used to provide for further understanding towards the present disclosure and constitute a part of the description, which are also used, together with the following embodiments, to explain the present disclosure and do not constitute a limitation to the present disclosure. In the drawings.

Therein, about the reference signs:

1: thin film transistor; 10: gate; 11: active layer; 12: source; 13: drain; 120: source first conductive layer; 121: source second buffer layer; 122: source first buffer layer; 123: oxide layer; 130: drain first conductive layer; 131: drain second buffer layer; 132: drain first buffer layer; 133: oxide layer.

DETAILED DESCRIPTION

In the following the specific embodiments of the present disclosure will be illustrated in detail in conjunction with the accompanying drawings. It should be understood that the specific embodiments as described herein are used only to illustrate and explain the present disclosure, rather than to limit the present disclosure.

Figure 1:
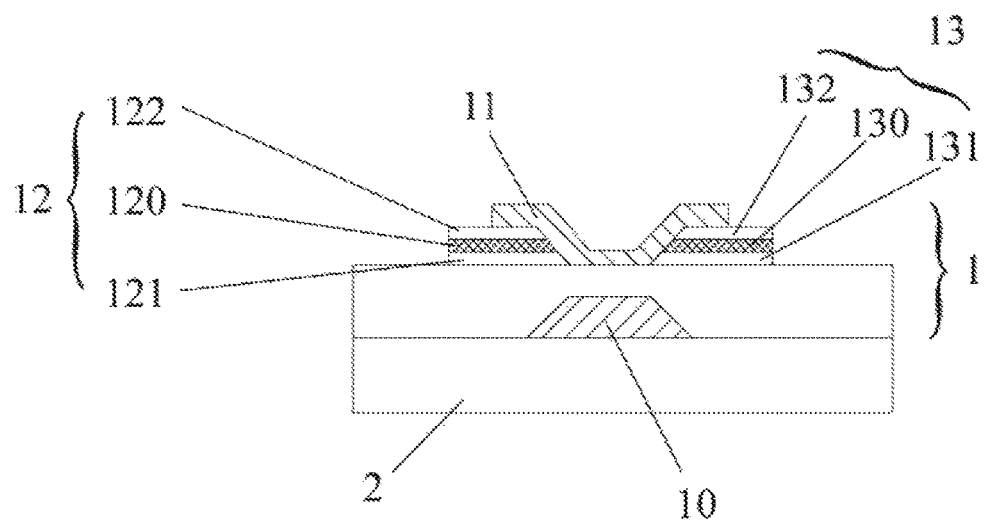
FIG. 1 is a schematic diagram of the structure of a thin film transistor in a prior art large-size display device.
Figure 2:
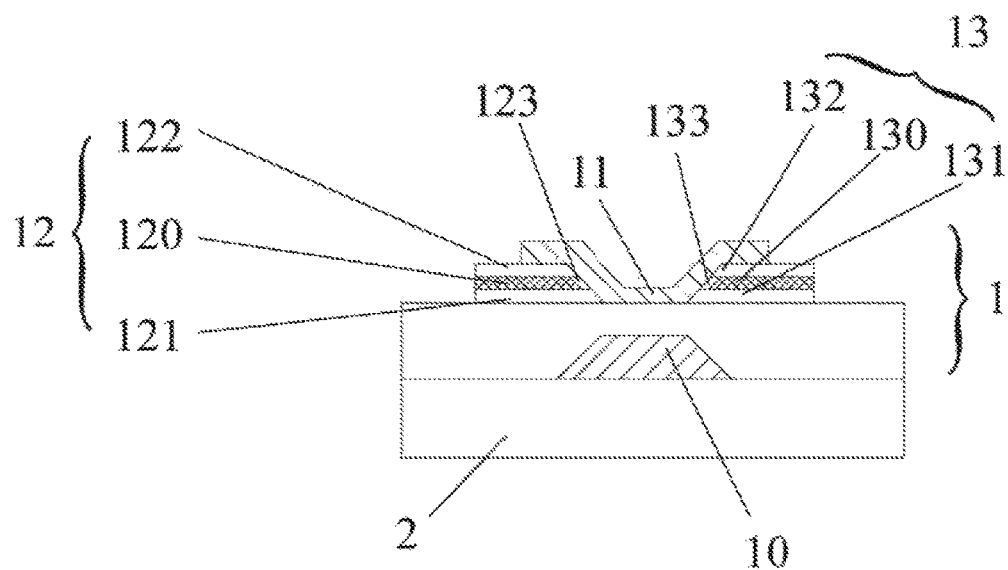
FIG. 2 is a schematic diagram of the structure of a thin film transistor provided according to an embodiment of the present disclosure.

FIG. 2 is a schematic diagram of the structure of a thin film transistor according to an embodiment of the present disclosure. As shown in FIG. 2, a thin film transistor 1 comprises a gate 10, an active layer 11, a source 12 and a drain 13, wherein the source 12 comprises a source first conductive layer 120 and a source first buffer layer 122, the source first buffer layer 122 is arranged on the source first conductive layer 120, the drain 13 comprises a drain first conductive layer 130 and a drain first buffer layer 132, the drain first buffer layer 132 is arranged on the drain first conductive layer 130; at least a part of an upper surface of the source first buffer layer 122 and at least a part of an upper surface of the drain first buffer layer 132 are in contact with a lower surface of the active layer 11, at least a part of a side wall of the source first conductive layer 120 and at least of a side wall of the drain first conductive layer 130 are in contact with the active layer 11; and the side wall of the source first conductive layer 120 in contact with the active layer 11 is formed with an oxide layer 123, the side wall of the drain first conductive layer 130 in contact with the active layer 11 is formed with an oxide layer 133. Specifically, the source first buffer layer 122 and the drain first buffer layer 132 are electrically conductive.

In the embodiment, the side wall of the source first conductive layer 120 in contact with the active layer 11 is formed with an oxide layer 123, which can avoid diffusion of the atoms/molecules in the source first conductive layer 120 into the active layer 11, and meanwhile, the oxide layer 123 can also reduce and even avoid absorption of the oxygen or other elements in the active layer 11 by the source first conductive layer 120, and thus can avoid changing of the composition of the active layer 11 by the source 12 in contact therewith. Similarly, the side wall of the drain first conductive layer 130 in contact with the active layer 11 is formed with an oxide layer 133, which can also avoid changing of the composition of the active layer 11 by the drain 13 in contact therewith. Therefore, the composition of the active layer 11 can remain unchanged and would not be damaged by the source 12 and the drain 13, in which way electron mobility can be guaranteed for the thin film transistor 1, and the thin film transistor 1 is maintained in a good electric property and stability.

In addition, the arrangement of the oxide layers 123, 133 can also improve the flatness of a surface of the source first conductive layer 120 and the drain first conductive layer 130 in contact with the active layer 11; an improved flatness also helps to avoid diffusion of the atoms/molecules in the source first conductive layer 120 and the drain first conductive layer 130 into the active layer 11, and avoid absorption of the oxygen or other elements in the active layer 11 by the source first conductive layer 120 and the drain first conductive layer 130, thereby further ensuring that the composition of the active layer 11 would not be damaged by the source 12 and the drain 13.

Specifically, the active layer 11 can be manufactured by an oxide semiconductor (e.g. IGZO, ITZO, etc.) in order to make the thin film transistor 1 have higher electron mobility.

In a prior art thin film transistor, aluminum (Al) is widely used as the material for the gate, source and drain, a resistivity of which is $2.83 \times 10^{-8}$ Ω·m. In the present disclosure, the resistivity of the source first conductive layer 120 and the drain first conductive layer 130 can be set lower than $2.83 \times 10^{-8}$ Ω·m, so as to make the resistance of the source 12 and the drain 13 of the thin film transistor 1 smaller than that of the source and the drain manufactured with Al in the prior art. Specifically, the source first conductive layer 120 may be made of at least one of copper (Cu), silver (Ag) and gold (Au), and the drain first conductive layer 130 may be made of at least one of copper (Cu), silver (Ag) and gold (Au); further, based on a consideration for reducing the manufacturing cost of the thin film transistor 1, the source first conductive layer 120 and the drain first conductive layer 130 can be manufactured with Cu.

In addition, the source 12 may further comprise a source second buffer layer 121 arranged below the source first conductive layer 120; the drain 13 may further comprise a drain second buffer layer 131 arranged below the drain first conductive layer 130. Specifically, the source second buffer layer 121 and the drain second buffer layer 131 may be manufactured with a material such as molybdenum (Mo), titanium (Ti), chromium (Cr), molybdenum niobium alloy (MoNb), etc. These materials have a greater adhesion to the base layer for arranging the source 12 and the drain 13 (located below the source 12 and the drain 13; when the thin film transistor 1 is a bottom gate structure, the base layer is generally a gate insulating layer, and when the thin film transistor 1 is a top gate structure, the base layer is generally the substrate 2), whereas the materials for manufacturing the source first conductive layer 120 and the drain first conductive layer 130, such as Cu, Ag, etc., have a smaller adhesion to the base layer. Therefore, by arranging the source second buffer layer 121 below the source first conductive layer 120 and the drain second buffer layer 131 below the drain first conductive layer 130, an adhesion between the source 12 and the base layer as well as between the drain 13 and the base layer can be increased, such that the source 12 and the drain 13 attain a better robustness.

By arranging a source first buffer layer 122 above the source first conductive layer 120 and a drain first buffer layer 132 above the drain first conductive layer 130, an upper surface of the source first conductive layer 120 and an upper surface of the drain first conductive layer 130 can be avoided a contact with the active layer 11; meanwhile, the atoms/molecules of the above materials in contact with the active layer 11 do not diffuse easily and are not vulnerable to oxidation, which accordingly can avoid changing of the composition of the active layer 11, and make the thin film transistor 1 have a good electric property and stability. In addition, the above materials can also form a fine electrical connection and ohmic contact with the active layer 11, which thus can reduce the resistance between the source 12 and the drain 13 when the thin film transistor 1 is switched on.

In the embodiment, the thin film transistor 1 may be a bottom gate structure, as shown in FIG. 2; wherein, the so-called "bottom gate" refers to the gate 10 of the thin film transistor 1 being located below the active layer 11. Specifically, when the thin film transistor 1 with the above-said bottom gate structure is manufactured, firstly patterns of the gate 10 and the gate insulating layer are manufactured in sequence, and then patterns of the source 12 and the drain 13 are manufactured, and after the patterns of the source 12 and the drain 13 are formed, a pattern of the active layer 11 is manufactured, such that the active layer 11 is between the source 12 and the drain 13.

Apart from a bottom gate structure, in the embodiment, the thin film transistor 1 may also be a top gate structure; wherein, the so-called "top gate" refers to the gate of the thin film transistor 1 being located above the active layer 11. Specifically, when the thin film transistor 1 with the above-said top gate structure is manufactured, firstly patterns of the source 12 and the drain 13 are manufactured, and after the patterns of the source 12 and the drain 13 are formed, a pattern of the active layer 11 is manufactured, such that the active layer 11 is between the source 12 and the drain 13, and at last, patterns of the gate insulating layer and the gate are manufactured in sequence.

In fact, manufacturing the patterns of the source 12 and the drain 13 may require the use of an acid etching liquid, whereas an oxide semiconductor is relatively sensitive to an acid etching liquid and can be easily corroded thereby. Therefore, if a pattern of the active layer 11 is to be firstly formed and patterns of the source 12 and the drain 13 are then formed, it is necessary to manufacture an etching stop layer after forming the pattern of the active layer 11, to prevent the active layer 11 from being damaged by the subsequent etching process for forming the source 12 and the drain 13. In the embodiment, no matter whether the thin film transistor 1 is a bottom gate structure or a top gate structure, the pattern of the active layer 11 is always manufactured after forming the patterns of the source 12 and the drain 13, in which way the etching stop layer can be omitted so that it helps to improve yield and enhance the resolution and the aperture ratio.

In addition, the oxide layer 123 of the source 12 can be obtained by oxidizing the source first conductive layer 120, and the oxide layer 133 of the drain 13 can be obtained by oxidizing the drain first conductive layer 130; when the source first conductive layer 120 and the drain first conductive layer 130 are manufactured with Cu, the oxide layer 123 and the oxide layer 133 can be a cupric oxide (CuO) or cuprous oxide ($Cu_2O$) from Cu oxidation; however, it can be understood that if the oxide layer 123 and the oxide layer 133 are $Cu_2O$, the oxygen in the active layer 11 can still be absorbed by $Cu_2O$, such that $Cu_2O$ is further oxidized as CuO, and thus, according to an example, the oxide layer 123 and the oxide layer 133 are CuO.

According to an example, both the oxide layer 123 of the source 12 and the oxide layer 133 of the drain 13 have a thickness no less than 5 nm, in order to ensure that the Cu atoms in the source first conductive layer 120 and the drain first conductive layer 130 would not diffuse into the active layer 11 and that the oxygen or other elements in the active layer 11 would not be absorbed by the source first conductive layer 120 and the drain first conductive layer 130.

In the thin film transistor 1 provided by the embodiment, the side wall of the source first conductive layer 120 in contact with the active layer 11 is formed with the oxide layer 123, and the side wall of the drain first conductive layer 130 in contact with the active layer 11 is formed with the oxide layer 133, which can avoid diffusion of the atoms/molecules in the source first conductive layer 120 and the drain first conductive layer 130 into the active layer 11, and avoid absorption of the oxygen or other elements in the active layer 11 by the source first conductive layer 120 and the drain first conductive layer 130, such that the composition of the active layer 11 would not be damaged by the source first conductive layer 120 and the drain first conductive layer 130, in which way electron mobility can be guaranteed for the thin film transistor 1, and the thin film transistor 1 is maintained in a good electric property and stability.

Figure 3:
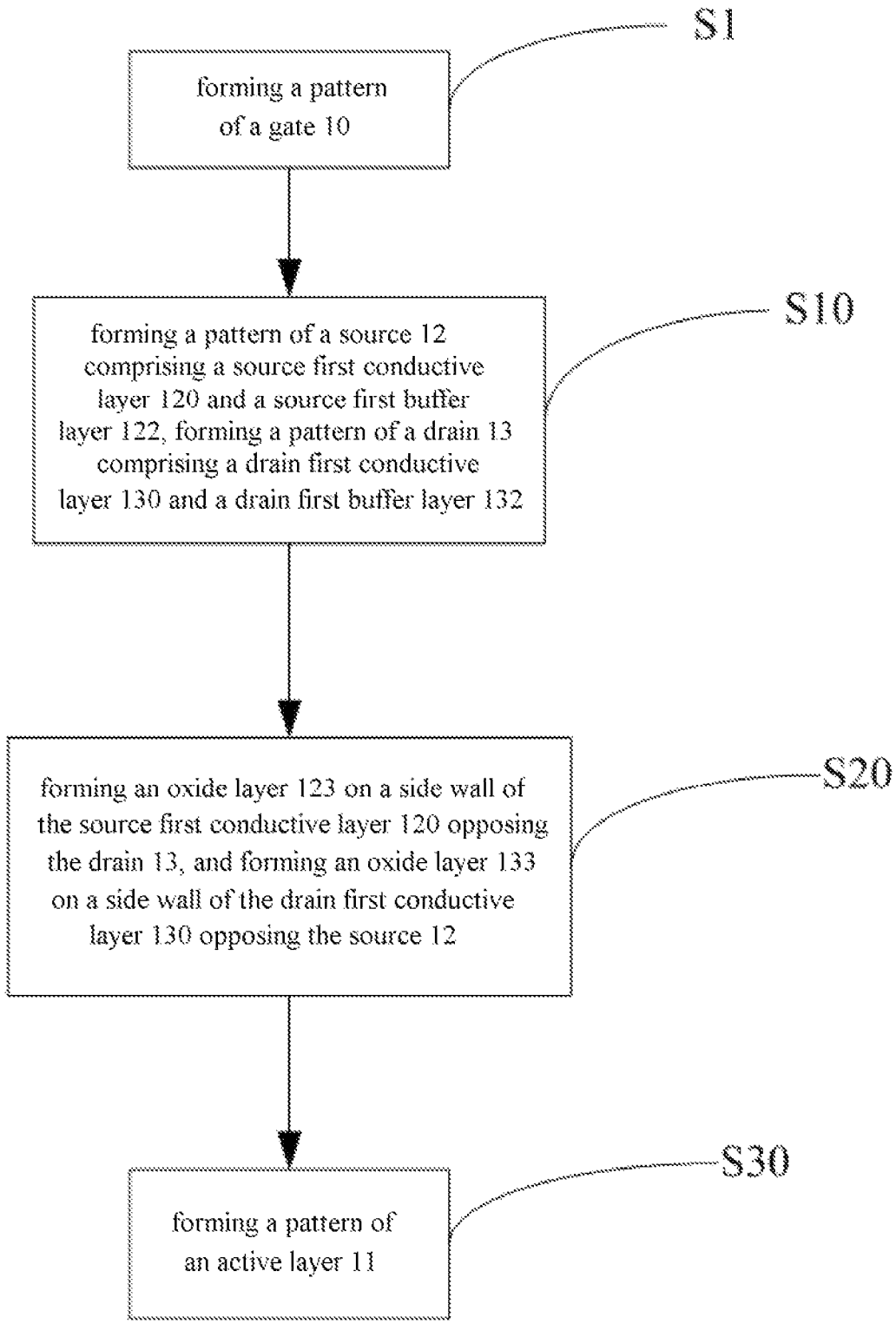
FIG. 3 is a flow chart of a method for manufacturing a thin film transistor according to one embodiment of the present disclosure.
Figure 4:
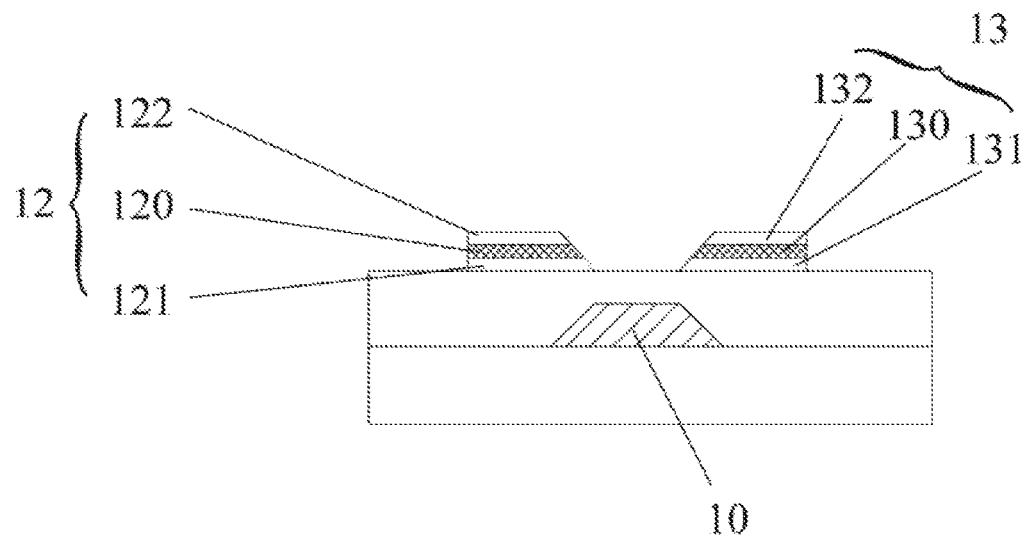
FIG. 4 is a schematic diagram of a pattern forming a source and a drain.

FIG. 3 is a flow chart of a method for manufacturing a thin film transistor according to one embodiment of the present disclosure. As shown in FIG. 3, the method for manufacturing the thin film transistor comprises the following steps S10-S30:

at S10, forming a pattern of a source 12 comprising a source first conductive layer 120 and a source first buffer layer 122, forming a pattern of a drain 13 comprising a drain first conductive layer 130 and a drain first buffer layer 132, as shown in FIG. 4.

Specifically, in step S10, the patterns of the source first conductive layer 120 and the drain first conductive layer 130 are obtained by sequentially performing deposition (Cu, Ag, etc.)→coating of a photoresist→exposure, to enable the photoresist denaturation in the corresponding region→development, to remove the denatured or natural photoresist→etching→removal of the remaining photoresist; after the patterns of the source first conductive layer 120 and the drain first conductive layer 130 are obtained, patterns of the source first buffer layer 122 and the drain first buffer layer 132 are obtained by performing the same steps of processing as the above, thereby obtaining the patterns of the source 12 and the drain 13 ultimately.

In a case where the source 12 further comprises a source second buffer layer 121, and the drain 13 further comprises a drain second buffer layer 131, in step S10, before forming the patterns of the source first conductive layer 120 and the drain first conductive layer 130, it is also necessary to form patterns of the source second buffer layer 121 and the drain second buffer layer 131, i.e. the patterns of the source second buffer layer 121 and the drain second buffer layer 131 are obtained by sequentially performing deposition (Mo, Ti, Cr, MoNb, etc.)→coating of a photoresist→exposure, to enable the photoresist denaturation in the corresponding region→development, to remove the denatured or natural photoresist→etching→removal of the remaining photoresist. The functions of the source second buffer layer 121 and the drain second buffer layer 131 have already been described in the above implementation of the thin film transistor, which will not be repeated here.

Figure 5:
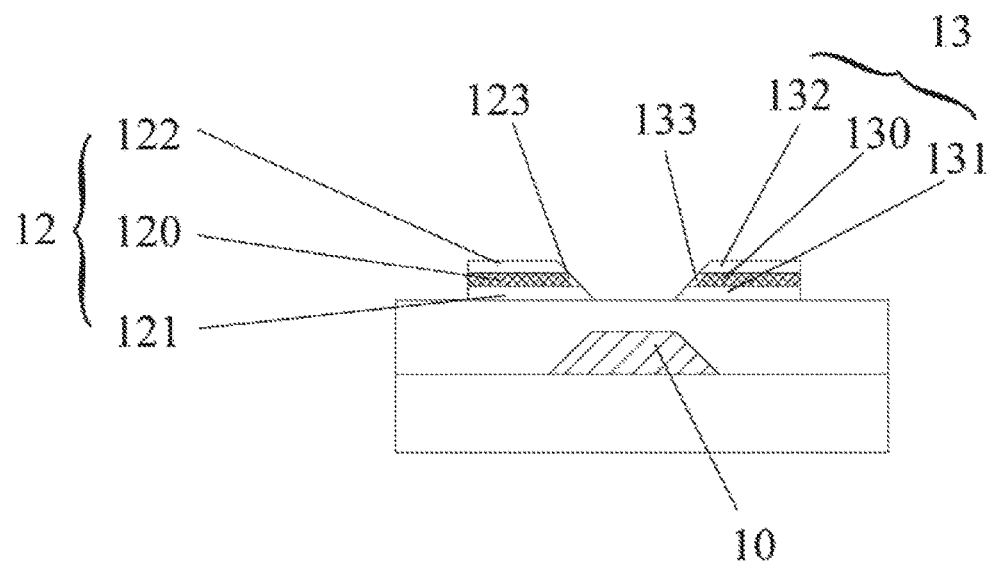
FIG. 5 is a schematic diagram of a pattern forming an oxide layer.

At S20, an oxide layer 123 is formed on a side wall of the source first conductive layer 120 opposing the drain 13, and an oxide layer 133 is formed on a side wall of the drain first conductive layer 130 opposing the source 12, as shown in FIG. 5.

Specifically, in step S20, a plasma of at least one of $N_2O$ and $O_2$ can be used to perform a plasma treatment of the side wall of the source first conductive layer 120 and the side wall of the drain first conductive layer 130, to oxidize the side wall surface of the source first conductive layer 120 and the side wall surface of the drain first conductive layer 130 such that oxide layers 123, 133 are obtained on the side wall of the source first conductive layer 120 opposing the drain 13 and on the side wall of the drain first conductive layer 130 opposing the source 12.

Figure 6:
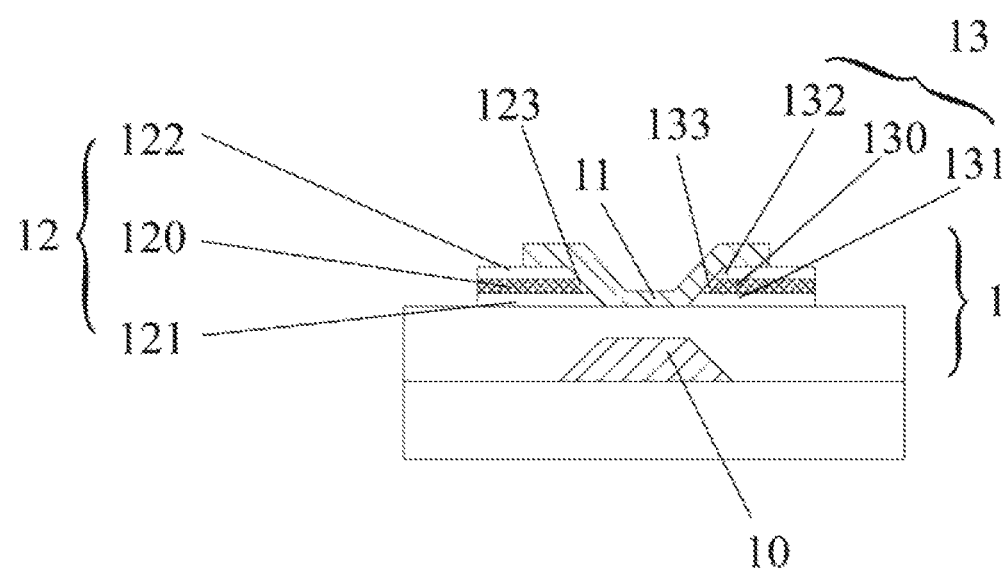
FIG. 6 is a schematic diagram of a pattern forming an active layer.

At step S30, a pattern of an active layer is formed, as shown in FIG. 6.

In step S30, the pattern of the active layer 11 made of an oxide semiconductor such as IGZO, ITZO, etc., can be obtained by sequentially performing deposition (IGZO, ITZO, etc.)→coating of a photoresist→exposure, to enable the photoresist denaturation in the corresponding region→development, to remove the denatured or natural photoresist→etching→removal of the remaining photoresist.

As the thin film transistor comprises a gate 10, a gate insulating layer, an active layer 11, a source 12 and a drain 13, the method for manufacturing the thin film transistor should also comprise a step of manufacturing the gate 10. Specifically, as shown in FIG. 3, the method for manufacturing the thin film transistor further comprises, prior to the step S10, a step S1: forming a pattern of a gate 10; in this case, the pattern of the gate 10 is located below the pattern of the active layer 11, and accordingly, the thin film transistor is a bottom gate structure.

Figure 7:
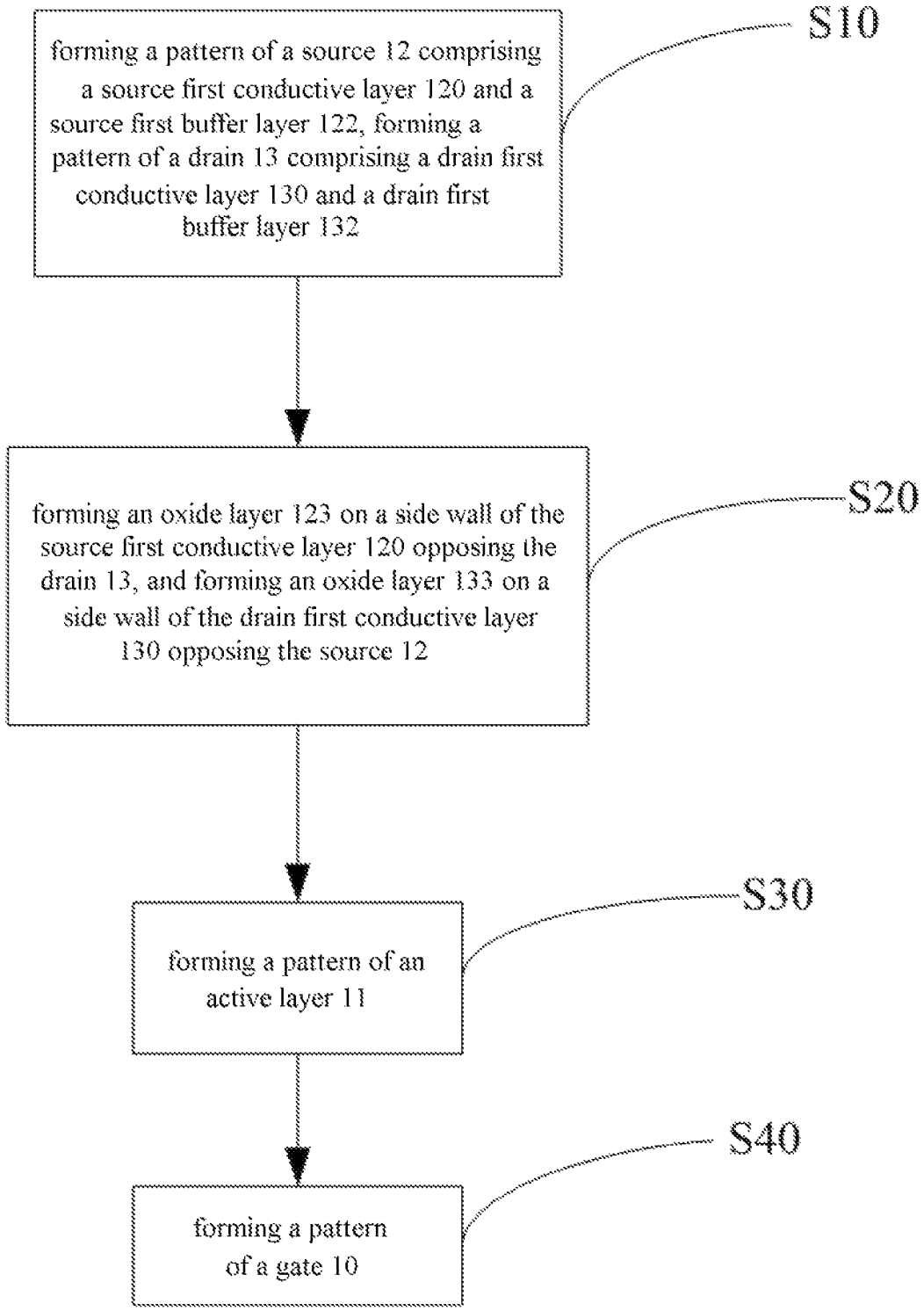
FIG. 7 is a flow chart of an alternative embodiment of the method for manufacturing a thin film transistor shown in FIG. 3.

The thin film transistor may also be a top gate structure. Correspondingly, apart from the embodiment of comprising the step S1, in an alternative embodiment, as shown in FIG. 7, the method for manufacturing the thin film transistor may also comprise, after the step S30, a step S40: forming a pattern of a gate. In this case, the pattern of the gate 10 is located above the pattern of the active layer 11, and accordingly, the thin film transistor is a top gate structure.

In the above method for manufacturing the thin film transistor, since the side wall of the source first conductive layer 120 opposing the drain 13 is formed with the oxide layer 123, and the side wall of the drain first conductive layer 130 opposing the source 12 is formed with the oxide layer 133, the oxide layers 123, 133 can avoid diffusion of the atoms/molecules in the source first conductive layer 120 and the drain first conductive layer 130 into the active layer 11, and avoid absorption of the oxygen or other elements in the active layer 11 by the source first conductive layer 120 and the drain first conductive layer 130, such that the composition of the active layer 11 would not be damaged by the source first conductive layer 120 and the drain first conductive layer 130, in which way electron mobility can be guaranteed for the thin film transistor 1, and the thin film transistor 1 is maintained in a good electric property and stability.

It is also an embodiment of the present disclosure to provide an array substrate, which comprises the thin film transistor provided according to the above implementation of the present disclosure.

In the array substrate provided by an embodiment of the present disclosure, a thin film transistor provided by the above embodiment of the present disclosure is used so that the thin film transistor can be maintained in a good electric property and stability, thus enabling the display apparatus using the array substrate to have a good displaying effect.

It can be understood that the above implementation is only exemplary for illustrating the principle of the present disclosure. However, the present disclosure is not limited thereto. For an ordinarily skilled person in the art, various modifications and improvements can be made without departing from the spirit and essence of the present disclosure, and these modifications and improvements are also regarded as the protection scope of the present disclosure.

The invention claimed is:

1. A thin film transistor comprising:
    a substrate;
    a source and a drain arranged over the substrate;
    an active layer arranged over the source and the drain and between the source and the drain;
    a gate insulating layer arranged over the active layer;
    a gate arranged over the gate insulating later;
    wherein:
        the source comprises:
            a source first conductive layer;
            a source first buffer layer arranged on the source first conductive layer; and
            a source second buffer layer arranged below the source first conductive layer and directly contacting the substrate;
        the drain comprises:
            a drain first conductive layer;
            a drain first buffer layer arranged on the drain first conductive layer; and
            a drain second buffer layer arranged below the drain first conductive layer and directly contacting the substrate;
    wherein at least a part of an upper surface of the source first buffer layer and at least a part of an upper surface of the drain first buffer layer are in contact with a lower surface of the active layer;
    wherein at least a part of a side wall of the source first conductive layer and at least a part of a side wall of the drain first conductive layer are in contact with the active layer;
    wherein the side wall of the source first conductive layer in contact with the active layer is formed of an oxide layer; and
    wherein the side wall of the drain first conductive layer in contact with the active layer is formed of an oxide layer;
    wherein the source second buffer layer is configured to increase adhesion between the source and the substrate, and the source second buffer layer comprises at least one of molybdenum, chromium, and molybdenum niobium alloy; and
    wherein the drain second buffer layer is configured to increase adhesion between the drain and the substrate, and the drain second buffer layer comprises at least one of molybdenum, chromium, and molybdenum niobium alloy.

2. The thin film transistor according to claim 1, wherein the active layer is formed of an oxide semiconductor.

3. The thin film transistor according to claim 1, wherein the source first conductive layer and drain first conductive layer have a resistivity lower than $2.83 \times 10^{-8}$ $\Omega \cdot m$.

4. The thin film transistor according to claim 1, wherein:
    the source first conductive layer is formed of at least one of copper, silver and gold; and
    the drain first conductive layer is formed of at least one of copper, silver and gold.

5. The thin film transistor according to claim 2, wherein:
    the source first conductive layer is formed of at least one of copper, silver and gold; and
    the drain first conductive layer is formed of at least one of copper, silver and gold.

6. The thin film transistor according to claim 3, wherein:
    the source first conductive layer is formed of at least one of copper, silver and gold; and
    the drain first conductive layer is formed of at least one of copper, silver and gold.

7. The thin film transistor according to claim 4, wherein:
    the oxide layer of the source is obtained by oxidizing the source first conductive layer; and
    the oxide layer of the drain is obtained by oxidizing the drain first conductive layer.

8. The thin film transistor according to claim 5, wherein:
    the oxide layer of the source is obtained by oxidizing the source first conductive layer; and
    the oxide layer of the drain is obtained by oxidizing the drain first conductive layer.

9. The thin film transistor according to claim 6, wherein:
    the oxide layer of the source is obtained by oxidizing the source first conductive layer; and
    the oxide layer of the drain is obtained by oxidizing the drain first conductive layer.

10. The thin film transistor according to claim 1, wherein the oxide layer of the source and the oxide layer of the drain both have a thickness that is not less than about 5 nm.

11. A method for manufacturing a thin film transistor, comprising:
    forming a pattern of a source and a pattern of a drain over a substrate;
    forming an oxide layer on a side wall of the source first conductive layer opposing the drain and an oxide layer on a side wall of the drain first conductive layer opposing the source;
    forming a pattern of an active layer over the source and the drain and between the source and the drain;
    forming a gate insulating layer over the active layer; and
    forming a pattern of a gate over the gate insulating layer;
    wherein the source comprises a source first conductive layer, a source first buffer layer arranged on the source first conductive layer, and a source second buffer layer arranged below the source first conductive layer and directly contacting the substrate;

wherein the drain comprises a drain first conductive layer, a drain first buffer layer arranged on the drain first conductive layer, and a drain second buffer layer arranged below the drain first conductive layer and directly contacting the substrate;

wherein the source second buffer layer is configured to increase adhesion between the source and the substrate, and the source second buffer layer comprises at least one of molybdenum, chromium, and molybdenum niobium alloy; and wherein the drain second buffer layer is configured to increase adhesion between the drain and the substrate, and the drain second buffer layer comprises at least one of molybdenum, chromium, and molybdenum niobium alloy.

12. The method for manufacturing a thin film transistor according to claim 11, wherein a plasma comprising at least one of N2O and O2 is used to perform a plasma treatment of the side wall of the source first conductive layer and the side wall of the drain first conductive layer, such that an oxide layer is formed on the side wall of the source first conductive layer opposing the drain and on the side wall of the drain first conductive layer opposing the source.

13. An array substrate comprising:
a thin film transistor comprising:
  a substrate;
  a source and a drain arranged over the substrate;
  an active layer arranged over the source and the drain and between the source and the drain;
  a gate insulating layer arranged over the active layer;
  a gate arranged over the gate insulating layer;
  wherein:
    the source comprises:
      a source first conductive layer;
      a source first buffer layer arranged on the source first conductive layer; and
      a source second buffer layer arranged below the source first conductive layer and directly contacting the substrate;
    the drain comprises:
      a drain first conductive layer;
      a drain first buffer layer arranged on the drain first conductive layer; and
      a drain second buffer layer arranged below the drain first conductive layer and directly contacting the substrate;

wherein at least a part of an upper surface of the source first buffer layer and at least a part of an upper surface of the drain first buffer layer are in contact with a lower surface of the active layer;

wherein at least a part of a side wall of the source first conductive layer and at least a part of a side wall of the drain first conductive layer are in contact with the active layer;

wherein the side wall of the source first conductive layer in contact with the active layer is formed of an oxide layer;

wherein the side wall of the drain first conductive layer in contact with the active layer is formed of an oxide layer;

wherein the source second buffer layer is configured to increase adhesion between the source and the substrate, and the source second buffer layer comprises at least one of molybdenum, chromium, and molybdenum niobium alloy; and wherein the drain second buffer layer is configured to increase adhesion between the drain and the substrate, and the drain second buffer layer comprises at least one of molybdenum, chromium, and molybdenum niobium alloy.

14. The array substrate according to claim 13, wherein the active layer is formed of an oxide semiconductor.

15. The array substrate according to claim 13, wherein the source first conductive layer and drain first conductive layer have a resistivity lower than $2.83 \times 10^{-8}$ $\Omega \cdot m$.

16. The array substrate according to claim 13, wherein:
the source first conductive layer is formed of at least one of copper, silver and gold; and
the drain first conductive layer is formed of at least one of copper, silver and gold.

17. The array substrate according to claim 14, wherein:
the source first conductive layer is formed of at least one of copper, silver and gold; and
the drain first conductive layer is formed of at least one of copper, silver and gold.

* * * * *